(12) United States Patent
Furukawa et al.

(10) Patent No.: US 6,815,737 B2
(45) Date of Patent: Nov. 9, 2004

(54) METHOD FOR SELECTIVE TRIMMING OF GATE STRUCTURES AND APPARATUS FORMED THEREBY

(75) Inventors: Toshiharu Furukawa, Essex Junction, VT (US); Mark C. Hakey, Milton, VT (US); Steven J. Holmes, Milton, VT (US); David V. Horak, Essex Junction, VT (US); Paul A. Rabidoux, Winooski, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/799,819

(22) Filed: Mar. 12, 2004

(65) Prior Publication Data

US 2004/0180484 A1 Sep. 16, 2004

Related U.S. Application Data

(62) Division of application No. 09/224,759, filed on Jan. 4, 1999, now Pat. No. 6,759,315.

(51) Int. Cl.7 .............................................. H01L 27/10
(52) U.S. Cl. ..................................... 257/204; 438/199
(58) Field of Search ................................ 257/204, 351; 438/199

(56) References Cited

U.S. PATENT DOCUMENTS

| | | | |
|---|---|---|---|
| 4,592,933 A | 6/1986 | Meyerson et al. | |
| 4,672,169 A | 6/1987 | Chambers | |
| 5,348,900 A | 9/1994 | Ayukawa et al. | |
| 5,364,804 A | 11/1994 | Ho et al. | |
| 5,376,578 A | 12/1994 | Hsu et al. | |
| 5,397,722 A | 3/1995 | Bashir et al. | |
| 5,476,802 A * | 12/1995 | Yamazaki et al. | 438/307 |
| 5,620,912 A | 4/1997 | Hwang et al. | |
| 5,668,065 A | 9/1997 | Lin | |
| 6,524,916 B1 * | 2/2003 | Scholer et al. | 438/270 |

OTHER PUBLICATIONS

Stanasolovich, et al. "Method for Reducing the Diffusion Contact Borders", IBM Technical Disclosure Bulletin, vol. 32, No. 4A, Sep. 1989, pp. 344–345.

Weiner et al. "Self Aligned Silicide Formation Using Gas Immersion Laser Annealing (GILA)", Ultratech Stepper technical brief, Mar. 3, 1997.

Weiner et al. "Ultrashallow Junction Formation Using Projection Gas Immersion laser Doping (PGILD)", Verdant Technologies technical brief, Aug. 20, 1997.

Derwent World Patent Index "Japanese Patent 8148680 Abstract", Jun. 7, 1996.

Jasinski et al. 27341 "Photochemical Deposition of Graded Silicon Nitride", Research Disclosure, Jan. 1987, No. 273.

Jasinski et al. 27343 "Photochemical Deposition of Silicon Nitride", Research Disclosure, Jan. 1987, No. 273.

(List continued on next page.)

*Primary Examiner*—David Nelms
*Assistant Examiner*—Quoc Hoang
(74) *Attorney, Agent, or Firm*—Schmeiser, Olsen & Watts; William D. Sabo

(57) ABSTRACT

A method for forming a trimmed gate in a transistor comprises the steps of forming a polysilicon gate conductor on a semiconductor substrate and trimming the polysilicon portion by a film growth method chosen from among selective surface oxidation and selective surface nitridation. The trimming step may selectively compensate n-channel and p-channel devices. Also, the trimming film may optionally be removed by a method chosen from among anisotropic and isotropic etching. Further, gate conductor spacers may be formed by anisotropic etching of the grown film. The resulting transistor may comprise a trimmed polysilicon portion of a gate conductor, wherein the trimming occurred by a film growth method chosen from among selective surface oxidation and selective surface nitridation.

17 Claims, 6 Drawing Sheets

OTHER PUBLICATIONS

Mihailescu et al. "Direct nitridation of a silicon surface by multipulse excimer laser irradiation in a nitrogen–containing ambient gas", Journal of Applied Physics 70, Aug. 15, 1991, pp 2123–2131.

Mihailescu et al. "Synthesis and deposition of silicon nitride films by laser reactive ablation of silicon in low pressure ammonia: A parametric study", Journal of Vacuum Science Technology 14, Jul./Aug. 1996, pp 1986–1994.

* cited by examiner

METHOD FOR SELECTIVE TRIMMING OF GATE STRUCTURES AND APPARATUS FORMED THEREBY

RELATED APPLICATION

This application is a divisional of Ser. No. 09/224,759; filed on Jan. 4, 1999 now U.S. Pat. No. 6,759,315.

This application is related to a patent application by Furukawa et al. entitled "METHOD FOR FORMING BORDERLESS GATE STRUCTURES AND APPARATUS FORMED THEREBY", Ser. No. 09/224,760, filed Jan. 4, 1999, which is incorporated herein by reference.

BACKGROUND OF THE INVENTION

1. Technical Field

This invention relates to the field of transistor gate conductor structures in semiconductor devices. More specifically, the invention relates to a method for forming a trimmed gate in a transistor and the apparatus formed thereby.

2. Background Art

The need to remain cost and performance competitive in the production of semiconductor devices has caused continually increasing device density in integrated circuits. To facilitate the increase in device density, new technologies are constantly needed to allow the feature size of these semiconductor devices to be reduced. The push for ever increasing device densities is particularly strong in complimentary metal-oxide semiconductor (CMOS) technologies, such as in the design and fabrication of field effect transistors (FETs). FETs are used in almost all types of integrated circuit design (i.e., microprocessors, memory, etc.)

One feature that increases device density is a "trimmed" gate conductor. In general, it is desirable to make gate conductors smaller in semiconductor devices so the associated FETs are faster and operate at lower power. Typically, lithographic methods are used to define gate conductors and then etch processes trim the lithographically formed structure to create sub-lithographic dimensions. However, etch processes are limited in the magnitude of material that can be trimmed from a gate conductor while still maintaining the proper scale of the device. That is, as more of the gate conductor is trimmed by etching, the risk of producing a distorted or defective gate conductor increase. Since sidewall spacers, contacts to diffusion areas, contacts to gates, etc. are typically formed after trimming, distorted gates can lead to misalignment of device components and failure of the device. Accordingly, additional methods are needed that may be combined with current methods or used alone to further trim gate conductors or trim gate conductors by a different technique than presently available.

Another problem with the current fabrication of FETs is that methods for device compensation are in need of improvement. Device compensation is where the relative size (i.e., the gate width to length ratio) of some devices is changed. There are several reasons why device compensation might be required. For example, the speed of CMOS FETs is critically dependent on the width to length ratio of a gate on a given device. In many cases, circuit design requires individual compensation of n-channel and p-channel performance to achieve proper timing between devices. This requires the ability to selectively compensate the width to length ratio of n-channel and p-channel devices. For example, the timing of logic circuitry critically depends on accurate speed control on n-channel as well as p-channel devices, and this may require shortening the length of all n-channel devices by one amount and shortening the length of all p-channel devices by another amount. Thus, as CMOS processes mature, the ability to selectively adjust the physical gate length of n-channel and p-channel devices to compensate for process and device-physics induced speed differences is needed.

Therefore, there existed a need to provide an improved method for trimming gate conductors and an improved method of selective device compensation.

DISCLOSURE OF INVENTION

According to the present invention, a method is provided for forming a trimmed gate in a transistor comprising the steps of forming a polysilicon portion of a gate conductor on a substrate having a semiconductor portion and trimming the polysilicon portion by a film growth method chosen from among selective surface oxidation and selective surface nitridation. By way of example, the trimming step may selectively compensate n-channel and p-channel devices. Also, the trimming film may optionally be removed by a method chosen from among anisotropic and isotropic etching. Further, gate conductor spacers may be formed by anisotropic etching of the grown film. Also according to the present invention, a transistor is provided comprising a trimmed polysilicon portion of a gate conductor, wherein the trimming occurred by a film growth method chosen from among selective surface oxidation and selective surface nitridation.

The foregoing and other features and advantages of the present invention will be apparent from the following more particular description of preferred embodiments of the invention, as illustrated in the accompanying drawings.

BRIEF DESCRIPTION OF DRAWINGS

Preferred embodiments of the present invention will hereinafter be described in conjunction with the appended drawings, where like designations denote like elements, and.

BEST MODE FOR CARRYING OUT THE INVENTION

According to a preferred embodiment of the present invention, a method is provided for forming a trimmed gate in a transistor comprising the steps of forming a polysilicon portion of a gate conductor on a substrate having a semiconductor portion and trimming the polysilicon portion by a film growth method chosen from among selective surface oxidation and selective surface nitridation. In one preferred embodiment, the trimming step may selectively compensate n-channel and p-channel devices. Also, the trimming film may optionally be removed by a method chosen from among anisotropic and isotropic etching. Further, gate conductor spacers may be formed by anisotropic etching of the grown film. Also according to another preferred embodiment of the present invention, a transistor is provided comprising a trimmed polysilicon portion of a gate conductor, wherein the trimming occurred by a film growth method chosen from among selective surface oxidation and selective surface nitridation.

Figure 1:
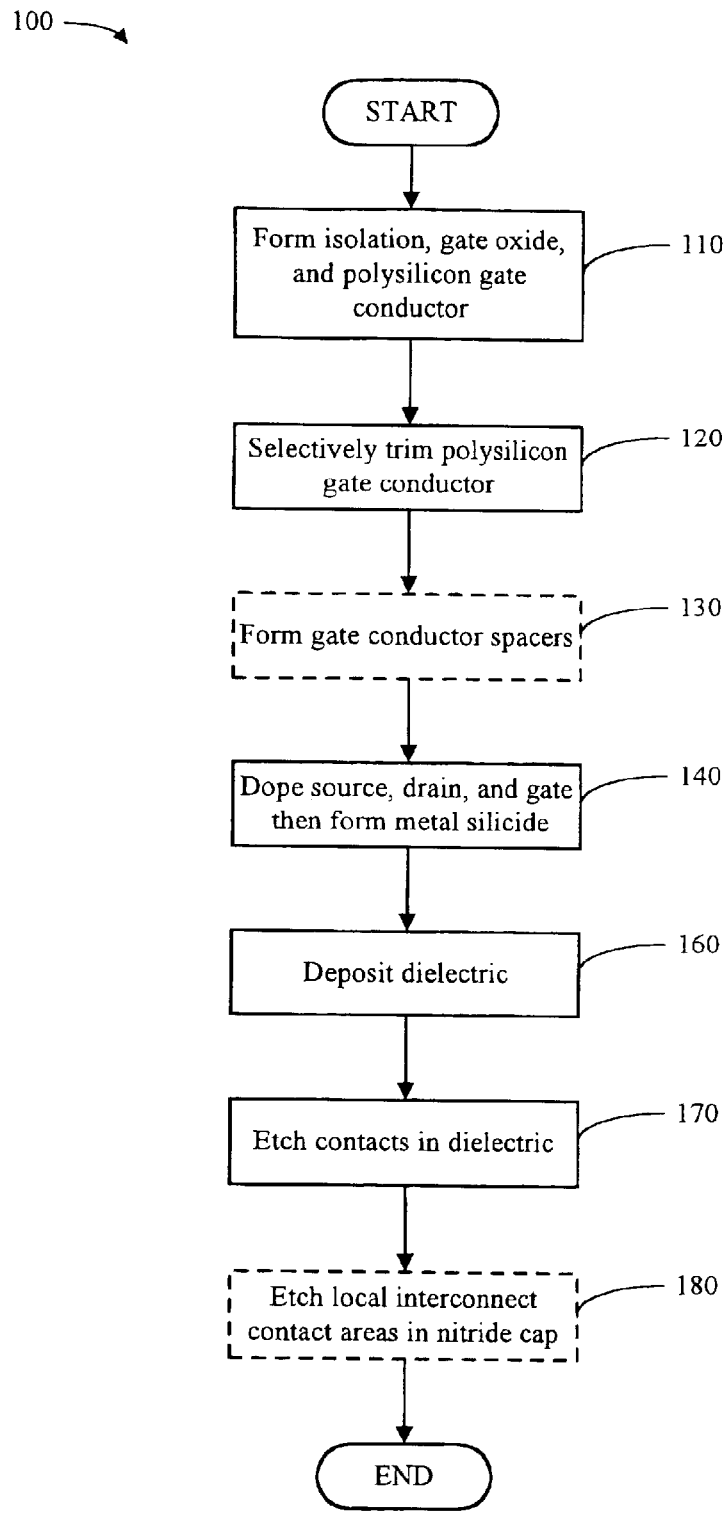
FIG. 1 is a flow diagram showing a method for selectively trimming gate structures according to a preferred embodiment of the present invention.
Figure 2:
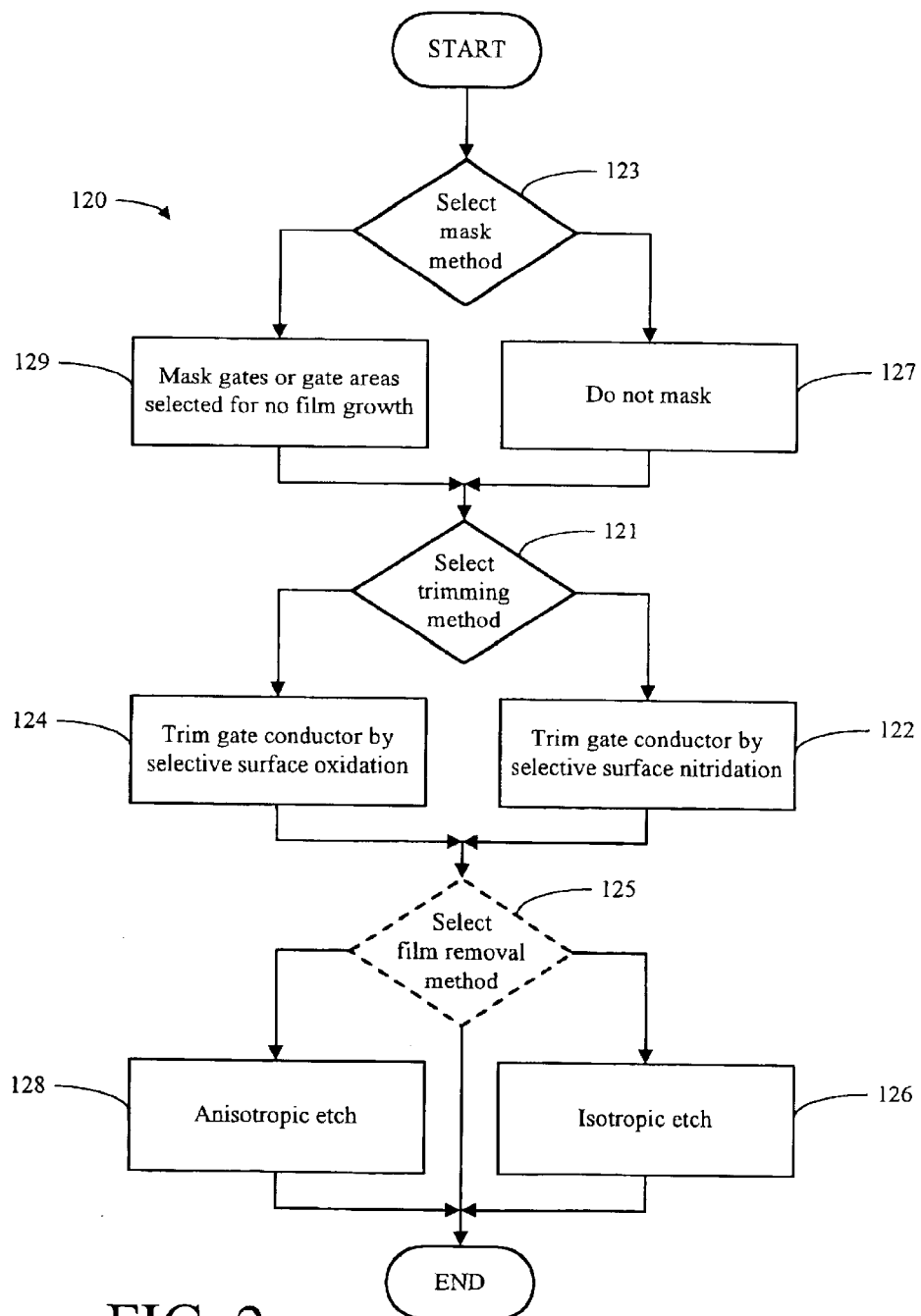
FIG. 2 is a detailed flow diagram for step 120 in FIG. 1.
Figure 3:
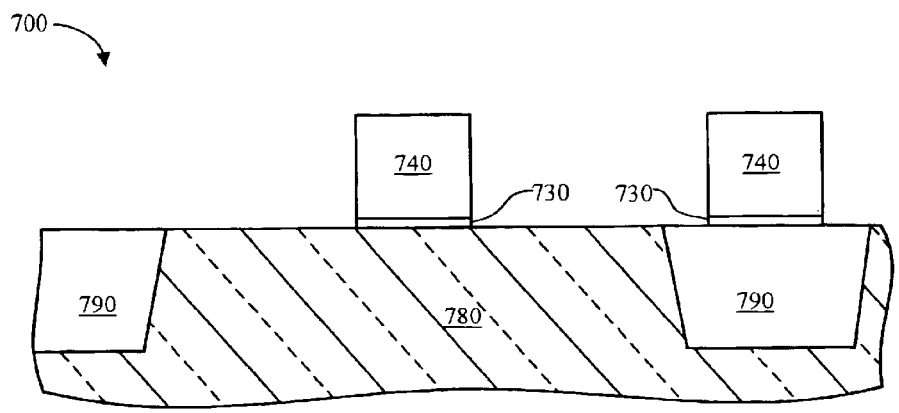
FIGS. 3–10 are cross-sectional views of wafer portions processed according to the various options presented for step 120 in FIG. 2.

Referring to FIGS. 1 and 2, a preferred method 100 for forming transistor gate structures is shown. In step 110 of method 100, a wafer portion 700, as shown in FIG. 3, is fabricated by forming isolation structures 790 in a semiconductor substrate 780 followed by formation of a layer of gate oxide on semiconductor substrate 780 and formation of a layer of polysilicon for a gate conductor on the layer of gate oxide. The layers are then patterned, removing unneeded portions and leaving gate oxide portion 730 and polysilicon portion 740. In step 120 of method 100, polysilicon portion 740 may be trimmed to scale down its dimensions so that the resulting gate conductor will be smaller and the associated field effect transistors (FETs) will be faster and operate at lower power.

If the trimming is performed selectively, then the trimming may comprise device compensation. That is, circuit design often requires individual compensation of n-channel and p-channel performance to achieve proper timing between devices. This may be accomplished according to a preferred embodiment of the present invention by trimming n-channel devices to a different extent than p-channel devices. For example, the timing of logic circuitry critically depends on accurate speed control on n-channel as well as p-channel devices, and this may require shortening the length of all n-channel devices by one amount and shortening the length of all p-channel devices by another amount. Preferably, p-channel devices are trimmed to a greater extent than n-channel devices to match their electrical performance with a difference of as much as 50–100 Angstroms (A). Understandably, there are several conceivable scenarios for selecting which devices will be trimmed and selecting the extent of trimming. Thus, it is within the scope of the present invention to trim polysilicon portion 740 to scale down its dimension, to accomplish device compensation, or to do both. Also, other polysilicon portions (not shown) may be selected for trimming to the same extent or a different extent.

FIG. 2 shows step 120 in more detail, wherein step 123 includes selecting either step 127 of not masking any gate conductors or step 129 of masking whole gate conductors or selected gate conductor areas. If device compensation is to be accomplished, then it may be necessary to mask selected p-channel or n-channel devices so their relative extent of trimming can be different. Also, it may be desirable to mask local interconnect or gate contact areas if the trimming film will not be removed from the gate conductor.

Step 121 includes selecting either step 122 of trimming by selective surface nitridation or step 124 of trimming by selective surface oxidation. Steps 122 and 124 essentially involve a novel, specialized technique for growing a silicon nitride or silicon oxide dielectric film on selected silicon-rich surfaces, such as polysilicon portion 740. By means of laser mediated film growth, these steps may selectively trim the exposed surface area of the gate conductor. Polysilicon portion 740 is irradiated, preferably at 308 nanometers (nm) wavelength, with a high-power laser irradiation system to heat the surface in the presence of ammonia or oxygen, causing formation and growth of a silicon nitride or silicon oxide film. Instead of oxygen, water mixed with oxygen could be used for faster oxide film formation and $N_2O$ could also be used. The properties of the polysilicon are such that it will absorb the laser irradiation and heat sufficiently to grow the dielectric film. The areas surrounding polysilicon portion 740 are not comprised of polysilicon, accordingly, it is unlikely that the surrounding areas will heat sufficiently to grow the dielectric film. For example, semiconductor substrate 780 is preferably single-crystal silicon, which has a higher thermal conductivity than polysilicon and readily dissipates heat from its exposed surface into the substrate. Preferably, polysilicon portion 740 is selectively irradiated by use of a masking feature with the laser irradiation system. If the irradiation is masked to only expose polysilicon portion 740, then it is even less likely that the dielectric film will grow anywhere other than on polysilicon portion 740.

To grow the film, the silicon at the surface of polysilicon portion 740 is converted to silicon nitride or silicon oxide, simultaneously scaling down the size of polysilicon portion 740. Essentially, the source for the silicon in the silicon nitride or silicon oxide film is the silicon atoms near the surface of polysilicon portion 740. Thus, as the silicon atoms near the surface are reacted to either silicon nitride or silicon oxide, the size of polysilicon portion 740 decreases. Conventionally, trimming is accomplished by means of a reactive ion etch (RIE) ash process on a resist pattern before a subtractive etch image transfer into the polysilicon of the gate conductor. These ash processes typically introduce line width variation, especially within a chip (due to loading effects) and across a wafer (due to chamber design effects). A photo-thermal process according to a preferred embodiment of the present invention offers an additional, and more precise, method of reducing the feature size of the gate conductor.

Figure 4:
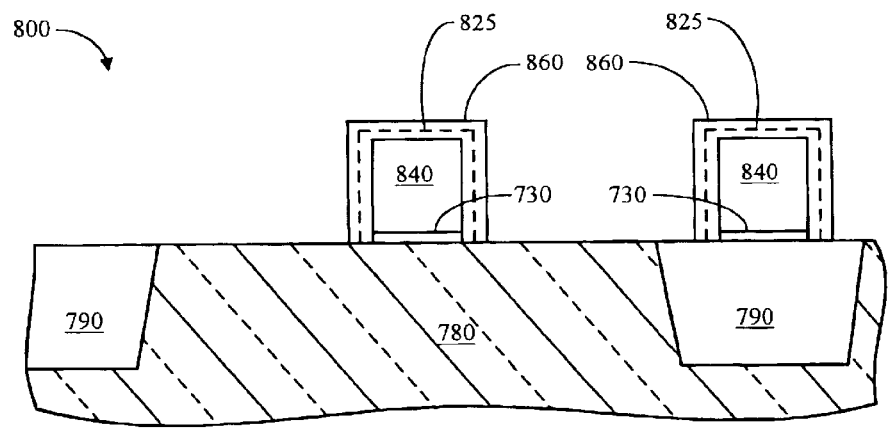

FIG. 4 shows wafer portion 800 wherein polysilicon portion 740 from FIG. 3 has been trimmed by either selective surface nitridation (step 122) or selective surface oxidation (step 124). Wafer portion 800 includes trimmed polysilicon portion 840 with a dielectric film 860 grown thereon according to a preferred embodiment of the present invention. Dashed line 825 indicates the dimension of polysilicon portion 740 prior to growth of dielectric film 860 and shows that the line width of trimmed polysilicon portion 840 is reduced compared to polysilicon portion 740 in FIG. 3. Also, FIG. 4 shows that dielectric film 860 essentially forms a cap surrounding polysilicon portion 840.

Figure 5:
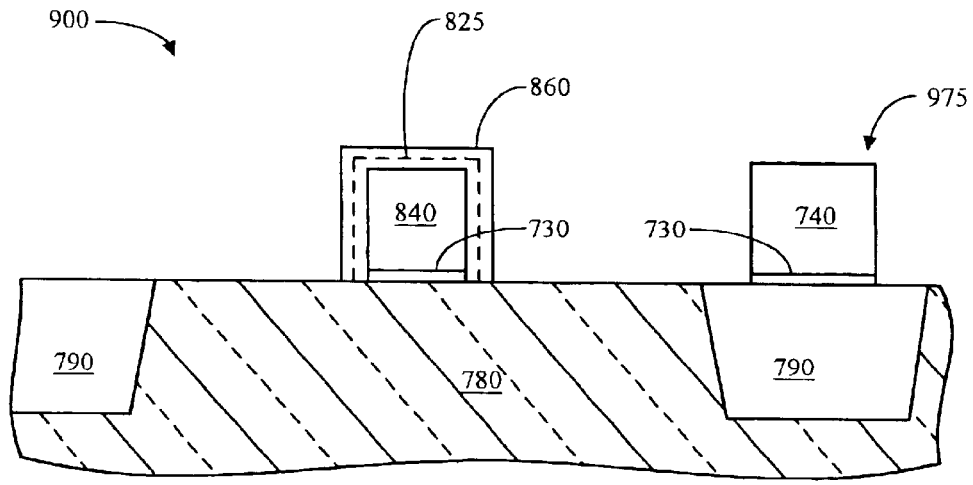

FIG. 5 shows wafer portion 900 wherein only one polysilicon portion 740 from FIG. 3 has been trimmed by either selective surface nitridation (step 122) or selective surface oxidation (step 124). Essentially, the masking feature of the masked, laser irradiation system can be used selectively to grow a nitride or oxide film on only a selected polysilicon portion 740 or even on only a part of polysilicon portion 740 (not shown). Thus, if local interconnect contact area 975 alone was masked from the laser irradiation, wafer portion 900 would include a partially trimmed polysilicon portion with a dielectric film grown partially thereon. Instead, all of a polysilicon portion 740 was masked to leave it untrimmed. Similar to FIG. 4, wafer portion 900 also includes trimmed polysilicon portion 840 with a dielectric film 860 grown thereon as previously described. Accordingly, dielectric film 860 essentially forms a cap surrounding polysilicon portion 840 while polysilicon portion 740 is uncapped. The option of no capping may be desirable to provide access to local interconnect contact area 975 in later processing.

Optional step 125 includes selecting step 126 of isotropically etching away dielectric film 860 or selecting step 128 of anisotropically etching away dielectric film 860. Of course, since step 125 is optional, it may be that neither etch is selected in favor of leaving dielectric film 860 in place. This may be advantageous if borderless contacts are to be used as described in the copending patent application by Furukawa et al. entitled "METHOD FOR FORMING BORDERLESS GATE STRUCTURES AND APPARATUS FORMED THEREBY", Ser. No. 09/224,760, filed Jan. 4, 1999, which is incorporated herein by reference. Borderless contacts require that the gate conductor be protected from electrical contact (shorting) with diffusion contacts formed nearby. Notably, dielectric film 860 may be used as a cap over trimmed polysilicon portion 840 to prevent shorting. Accordingly, if film 860 is left in place, then a subsequently formed diffusion contact may be borderless. It then becomes particularly beneficial that a partial film may be formed in the region where it is desirable to provide local interconnect contact area 975. Otherwise, an additional film removal step to expose a local interconnect contact area would be required. Unfortunately, leaving film 860 in place would require doping the polysilicon before forming film 860. Instead, it is more preferred either to completely remove film 860 by step 126 of isotropically etching or to partially remove film 860 by step 128 of anisotropically etching.

Figure 6:
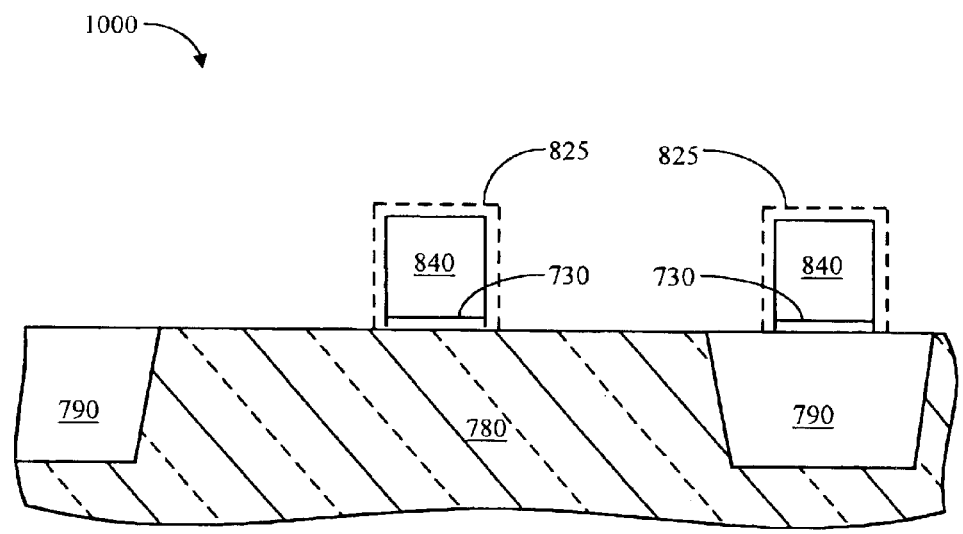
Figure 7:
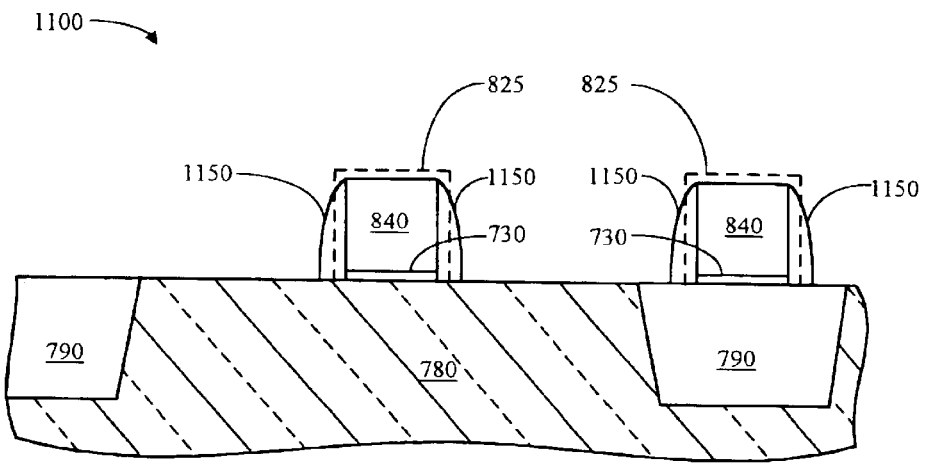

Step 126 of isotropically etching silicon nitride or silicon oxide from wafer portion 800 is exemplified by wafer portion 1000 in FIG. 6. As shown in FIG. 6, isotropic etching removes dielectric film 860 from wafer portion 800, leaving trimmed polysilicon portion 840. As stated previously, dashed line 825 indicates the dimension of polysilicon portion 740 prior to the growth of dielectric film 860 that formed trimmed polysilicon portion 840. Step 128 of anisotropically etching wafer portion 800 is exemplified by wafer portion 100 in FIG. 7. As shown in FIG. 7, anisotropic etching removes only a portion of dielectric film 860 from wafer portion 800. The etch selected for wafer portion 1100 left gate conductor spacers 150 on the sides of polysilicon portion 840. Formation of spacers is desirable prior to doping of the source and drain for a FET, accordingly, step 128 can be used both to provide a trimmed gate conductor and spacers for doping.

After step 120, method 100 in FIG. 1 shows optional step 130 of forming gate conductor spacers. Step 130 is considered optional in the event that spacers are not desired or spacers were previously formed in association with the trimming in step 120. Also, depending on the dimension of any spacers formed in step 120, it may be desirable to form additional spacer material over spacers from step 120. Accordingly, if a spacer of a certain desired dimension is not produced in step 120, the dimension may be increased in step 130 to complete formation of gate conductor spacers.

Step 140 of doping the source, drain, and gate then forming metal silicide is next, wherein "doping" includes ion implantation, chemical doping by heating the wafer portion in the presence of a dopant, and other methods known to those skilled in the art for forming diffusion areas and doping polysilicon gate conductors. Forming metal silicide in step 140 includes methods known to those skilled in the art for forming $TiSi_x$, $CoSi_x$, or other metal suicides in the surface of diffusion areas and gate conductors to decrease sheet resistance. While it is preferred that step 140 include some effort to decrease sheet resistance, it is conceivable that such effort may not be necessary in all cases. Accordingly, forming metal silicide is considered optional in step 140 of the present invention. It is also an advantage that a single step may be used to form metal silicide in diffusion areas as well as in a gate conductor. If a gate conductor were left capped during trimming step 120, then it would be necessary to form metal silicide after doping the gate conductor, but prior to such capping, and step 140 would only include forming metal silicide in diffusion areas.

Figure 8:
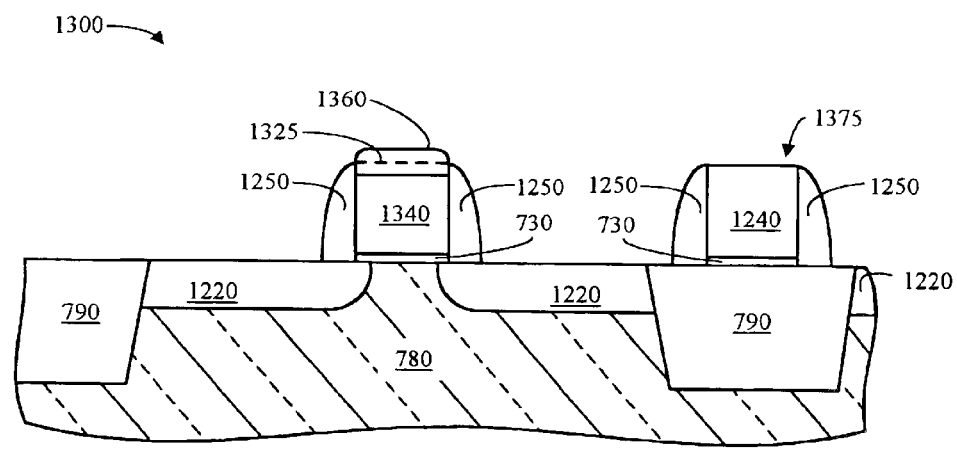

FIG. 8 shows wafer portion 1300 wherein the order of the steps in method 100 has been changed such that step 120 follows step 140. That is, gate conductor 1340 has been trimmed by selective surface nitridation or oxidation (steps 122 or 124) with masking of gate conductor 1375 (step 129) after forming spacers and doping the source, drain, and gate. Accordingly, wafer portion 1300 includes gate conductor spacers 1250, which may be formed in step 120, 130, or both, and diffusion areas 1220. Wafer portion 1300 also includes a dielectric film 1360 grown on gate conductor 1340 after step 140 according to an alternative preferred embodiment of the present invention. As a further alternative, wafer portion 1300 would also be formed if gate conductor 1340 was doped, spacers 1250 formed, dielectric film 1360 grown, and then diffusion areas 1220 doped, but that option is not preferred since two doping steps are required. Dashed line 1325 indicates the dimension of the gate conductor prior to growth of dielectric film 1360 and shows that the dimension of gate conductor 1340 is reduced compared to its prior dimension. Also, FIG. 8 shows that dielectric film 1360 essentially forms a cap to isolate gate conductor 1340. In keeping with step 120, dielectric film 1360 may be removed or left in place. If left in place, then dielectric film 1360 may be useful in later forming borderless diffusion contacts as indicated in the copending patent application referenced above.

As described earlier, the growth of dielectric film by selective surface nitridation involves absorbing of laser irradiation and reacting silicon atoms near the surface to form silicon nitride. Accordingly, if the material does not sufficiently heat upon absorbing laser irradiation, then no dielectric film will grow. Also, if a particular surface is more rich in silicon than another surface, then the silicon-rich surface will tend to promote faster dielectric film growth compared to the other surface. It is even conceivable that no dielectric film will grow on a surface that is sufficiently silicon-poor. Preferably, gate conductor 1340 is doped polysilicon and gate conductor spacers 1250 are common silicon oxide or silicon nitride. Thus, gate conductor 1340 is preferably silicon-rich and will grow dielectric film 1360 faster than gate conductor spacers 1250. Nevertheless, other material known to those skilled in the art may be used for gate conductor spacers 1250 that are silicon-rich and will heat sufficiently upon absorbing laser irradiation. Such materials include silicon-rich silicon oxynitride and silicon-rich silicon nitride. The result is that dielectric film 1360 may be equally thick in the region capping gate conductor 1340 as it is in the region capping gate conductor spacers 1250. Accordingly, the scope of the invention includes various thickness scenarios for dielectric film 1360 and the related methods of formation.

Figure 9:
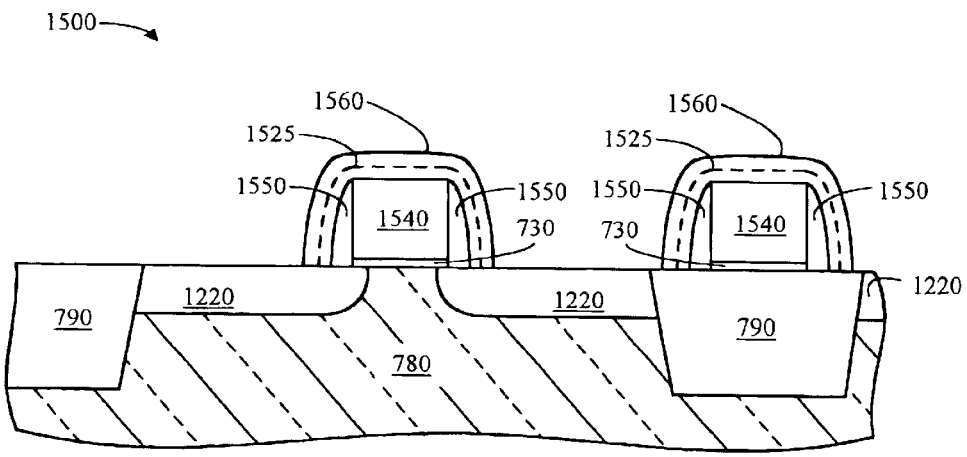

FIG. 9 shows wafer portion 1500 wherein the gate conductors have been trimmed by selective surface nitridation (step 122) without masking gates or gate areas (step 129). Notably, step 129 does not preclude masking all areas except the gate conductors. Wafer portion 1500 includes gate conductors 1540 with a dielectric film 1560 grown thereon according to a preferred embodiment of the present invention. Also, the gate conductor spacers are formed of silicon-rich silicon oxynitride so a nitride film is grown thereon as well. Dashed line 1525 indicates the dimension of gate conductor 1540 and gate conductor spacers 1550 prior to growth of dielectric film 1560 and shows that the dimension of gate conductor 1540 and gate conductor spacers 1550 is reduced compared to their prior dimension. Also, FIG. 9 shows that dielectric film 1560 essentially forms a cap surrounding gate conductor 1540 and gate conductor spacers 1550.

Figure 10:
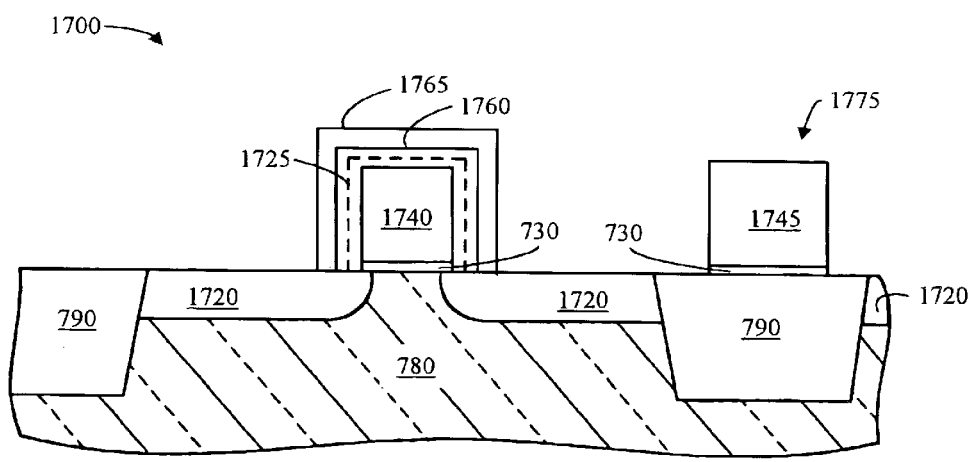

Although not a preferred embodiment, FIG. 10 shows yet another of the many possible embodiments within the scope of the present invention. Notably, wafer portion 1700 does not include spacers formed in the usual manner. Accordingly, the method used to produce wafer portion 1700 involved doping gate conductor 1740 and 1745, trimming gate conductor 1740, leaving dielectric film 1760 in place after trimming, doping diffusion areas 1720, and capping dielectric film 1760 with additional dielectric films 1765. Growth of additional dielectric film 1765 may be needed when a thicker dielectric layer than was grown during trimming is desired to sufficiently cap gate conductor 1740 or form spacers for deposition. Noticeably, despite the two layers of grown dielectric film interconnect contact area 1775 remains open for formation of interconnect contacts without requiring an etch through a dielectric film. Also, additional dielectric film 1765 did not cause further trimming of gate conductor 1740.

Next, step 160 of method 100 includes deposition of a conformal dielectric layer, such as a passivation oxide, to cover the fabricated structures discussed above, filling gaps and voids. Any dielectric layer known to be suitable by those skilled in the art may be used. In step 170 contact holes are etched into the passivation oxide for diffusion contacts and, possibly, for local interconnect contacts. If interconnect contact areas were left open during trimming and capping, then diffusion contacts and local interconnect contacts may be defined with a single mask. If interconnect contact areas are covered with a dielectric film from trimming or capping, then an additional silicon nitride or silicon oxide etch is required to open the interconnect contact areas. Thus, an additional mask for etching open the local interconnect contacts alone will be required. Accordingly, optional step 180 may be required to provide another mask and etch of the portion of a dielectric layer covering the desired local interconnect contact area. Once method 100 is completed as described above, then metallization may be deposited to form diffusion contacts and local interconnect metallization.

Given the numerous options that are possible within method 100 of FIG. 1, there are numerous possibilities for structures that may be produced. FIGS. 3–10 present only a few of the possible wafer portions that may result from method 100 and other wafer portions are conceivable that are within the scope of the present invention according to the preferred embodiment for method 100 shown in FIG. 1 and discussed above. The examples below set forth specific process conditions for performing the various steps of method 100 and, thus, each is presented as a more preferred embodiment of method 100.

EXAMPLE 1

Substrate Preparation. A complimentary metal-oxide semiconductor (CMOS) logic silicon substrate is prepared which has isolation trench structures, gate oxide, polysilicon gate conductor with oxide/nitride spacers, and diffusion areas defined. In a typical application, the isolation trench is etched 0.2–0.3 micrometers ($\mu$m) into the silicon wafer. The gate oxide is 3–5 nanometers (nm) thick. The polysilicon gate is 0.10–0.25 $\mu$m wide and 0.1–0.2 $\mu$m thick. The spacers are 10–20 nm thick for the oxide layer and 20–30 nm thick for the nitride layer. In a CMOS structure such as this, the gate conductor and diffusions have been doped after etching the gate, to provide sufficient conductivity. After the doping is performed, the gate conductor can be selectively nitrided or oxided, covering all areas of the gate conductor except where the local interconnect must make contact or where not trimming is desired. A selective nitridation or oxidation is accomplished by using a masked laser irradiation (308 nm) of the substrate. This masked irradiation process utilizes the masked, high-power laser irradiation system commercialized by Verdant Technologies, a subsidiary of Ultratech. This masked laser expose system is capable of providing up to 500 milliJoules (mJ)/square centimeter ($cm^2$) of energy fluence at the wafer surface for each laser pulse. This level of energy is sufficient to melt the surface of polysilicon materials on the substrate. The examples below indicate the preferred process conditions under which selective nitridation or oxidation may be accomplished.

EXAMPLE 2

Trimming by Selective Surface Nitridation or Oxidation. In a further embodiment of gate conductor processing by means of laser mediated film growth, one may use these methods to selectively trim the gate conductor line width by means of growing a dielectric film around the entire exposed surface area of the gate conductor. In this application, one generally desires to grow about 10–30 nm of nitride (or oxide), rather than the 50–100 nm of nitride generally described for the borderless contact copending patent application referenced above. As a result, when nitride is grown to trim the gate conductor, milder process conditions are used for ammonia pressure and the number of pulses. When nitride is grown, the energy fluence is maintained at 400–500 $mJ/cm^2$ per pulse in order to effectively melt the surface of the polysilicon.

A wafer substrate is provided as described in EXAMPLE 1 above, except that the oxide and nitride spacers on the gate conductor are eliminated. In place of these spacers, an oxide or nitride film is photo-thermally grown around the exposed surfaces of the polysilicon gate conductor. The wafer is placed in an ammonia environment of 10–1500 torr at 100 ccm/min, or more preferably about 300–500 torr in this example. The wafer is irradiated with laser energy at 308 nm at a fluence of 400–500 $mJ/cm^2$ per pulse, for a duration of 50–1000 pulses, or more preferably about 150 pulses. A mask may be used in this irradiation process to create openings in the surface nitride for the local interconnect or gate contact or to prevent trimming of selected gate conductors. This will not cause defects in the line width trimming process, as the local interconnect does not contact the gate conductor in areas of critical dimension. The nitride layer can be used for an implant spacer as well, in place of the oxide spacer which was eliminated from the initial substrate preparation process described in EXAMPLE 1. It may be desirable to form a second spacer of nitride or oxide over this photo-thermally deposited cap if other channel tailoring implants are required.

If an oxide trimming layer is desired rather than nitride, it can be grown at more relaxed exposure conditions, as the formation of oxide does not require a melting of the silicon surface. Accordingly, energy fluences of 200–400 $mJ/cm^2$ are used, with the number of expose pulses at 50–1000, preferably about 150. Oxygen pressures of 1–760 torr, or more preferably about 100–300 torr, at 100 ccm/min are used. When oxide trimming is used in conjunction with nitridation to form borderless contacts, it may be desirable to remove the oxide layer from the upper surface of the gate conductor prior to forming the nitride. This can be accomplished with a brief RIE process or with a dilute buffered hydrofluoric acid (BHF) clean. The wet clean removes the oxide layer from the sides of the gate conductor as well as from the upper surface, while the RIE can be used to selectively remove the oxide from only the surface of the gate conductor.

While the invention has been particularly shown and described with reference to preferred embodiments thereof, it will be understood by those skilled in the art that various changes in form and details may be made therein without departing from the spirit and scope of the invention. Accordingly, unless otherwise specified, any dimensions of the apparatus indicated in the drawings or herein are given as an example of possible dimensions and not as a limitation. Similarly, unless otherwise specified, any sequence of steps of the method indicated in the drawings or herein are given as an example of a possible sequence and not as a limitation. For example, it will also be understood by those skilled in the art that the invention is applicable to different isolation technologies (e.g., LOCOS, recessed oxide (ROX), etc.), well and substrate technologies, dopant types, energies and species. It will also be understood that the spirit of the invention is applicable to other semiconductor technologies (e.g., BiCMOS, bipolar, silicon on insulator (SOI), silicon germanium (SiGe), etc.).

What is claimed is:

1. An electrical structure, comprising:
    a semiconductor substrate having an electrically insulative isolation structure therein, wherein a top surface of the substrate and a top surface of the isolation structure are coplanar;
    a first gate oxide layer on the substrate and in direct mechanical contact with the top surface of the substrate;
    a first polysilicon layer on the first gate oxide layer and in direct mechanical contact with the first gate oxide layer;
    a second gate oxide layer on the isolation structure and in direct mechanical contact with the top surface or the isolation structure, wherein the first and second gate oxide layers have a same thickness in a first direction perpendicular to the top surface of the substrate, and wherein the first gate oxide layer has a smaller width than the second gate oxide layer in a second direction parallel to the top surface of the substrate; and
    a second polysilicon layer on the second gate oxide layer and in direct mechanical contact with the second gate oxide layer, wherein the first polysilicon layer has a smaller thickness than the second polysilicon layer in the first direction, and wherein the first polysilicon layer has a smaller width than the second polysilicon layer in the second direction.

2. The electrical structure of claim 1, further comprising a first dielectric film surrounding and in direct mechanical contact with the first gate oxide layer and the first polysilicon layer and in direct mechanical contact with the top surface of the substrate, wherein a combined thickness of the first polysilicon layer and the first dielectric film in the first direction exceeds the thickness of the second polysilicon layer in the first direction, and wherein a combined width of the first polysilicon layer and the first dielectric film in the second direction exceeds the width of the second polysilicon layer in the second direction.

3. The electrical structure of claim 2, further comprising a second dielectric film surrounding and in direct mechanical contact with the first dielectric film and in direct mechanical contact with the top surface of the substrate.

4. The electrical structure of claim 3, further comprising a diffusion area in the substrate, wherein the top surface of the substrate and a top surface of the diffusion area are coplanar, and wherein the top surface of the diffusion area is in direct mechanical contact with the first gate oxide layer, the first dielectric film, and the second dielectric film.

5. The electrical structure of claim 2, wherein the first dielectric film comprises silicon oxide.

6. The electrical structure of claim 2, wherein the first dielectric film comprises silicon nitride.

7. The electrical structure of claim 1, further comprising a dielectric cap layer on the first polysilicon layer and in direct mechanical contact with a top surface of the first polysilicon layer, and wherein the top surface of the first polysilicon layer is about parallel to the top surface of the substrate.

8. The electrical structure of claim 7, further comprising an electrically insulative spacer in direct mechanical contact with the first gate oxide layer, the first polysilicon layer, and a side surface of the dielectric cap layer, and whereon a portion of the side surface of the dielectric cap layer is not in mechanical contact with the spacer.

9. The electrical structure of claim 8, further comprising a diffusion area in the substrate, wherein the top surface of the substrate and a top surface of the diffusion area are coplanar, and wherein the top surface of the diffusion area is in direct mechanical contact with the first gate oxide layer and the spacer.

10. The electrical structure of claim 7, wherein the dielectric cap layer comprises silicon oxide.

11. The electrical structure of claim 7, wherein the dielectric cap layer comprises silicon nitride.

12. The electrical structure of claim 7, wherein the spacer comprises a silicon-rich material.

13. The electrical structure of claim 12, wherein the silicon-rich material comprises silicon-rich silicon nitride.

14. The electrical structure of claim 12, wherein the silicon-rich material comprises silicon-rich silicon oxynitride.

15. The electrical structure of claim 1, wherein the substrate comprises single crystal silicon.

16. The electrical structure of claim 1, wherein the thickness of the first gate oxide in the first direction is 3 to 5 nanometers.

17. A structure comprising:
    a semiconductor substrate;
    a first gate oxide layer on the substrate and in direct mechanical contact with the top surface of the substrate;
    a first polysilicon layer on the first gate oxide layer and in direct mechanical contact with the first gate oxide layer;
    an electrically insulative isolation structure within the substrate, wherein the top surface of the substrate and a top surface of the insulation structure are coplanar;
    a second gate oxide layer on the isolation structure and in direct mechanical contact with the top surface of the isolation structure; and
    a second polysilicon layer on the second gate oxide layer and in direct mechanical contact with the second gate oxide layer, wherein the first polysilicon layer has a smaller thickness than the second polysilicon layer in a first direction perpendicular to the top surface of the substrate, and wherein the first polysilicon layer has a smaller width than the second polysilicon layer in a second direction parallel to the top surface of the substrate.

* * * * *